(12) United States Patent
Fiedler et al.

(10) Patent No.: US 12,249,962 B2
(45) Date of Patent: Mar. 11, 2025

(54) METHOD FOR CONTROLLING A DRIVER CIRCUIT, DRIVER CIRCUIT, SYSTEM COMPRISING A DRIVER CIRCUIT AND METHOD FOR MANUFACTURING AN INTEGRATED CIRCUIT

(71) Applicant: Fraunhofer-Gesellschaft zur Foerderung der angewandten Forschung e.V., Munich (DE)

(72) Inventors: Raik Fiedler, Dresden (DE); Marcus Pietzsch, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 236 days.

(21) Appl. No.: 17/662,170

(22) Filed: May 5, 2022

(65) Prior Publication Data
US 2022/0263473 A1    Aug. 18, 2022

Related U.S. Application Data

(63) Continuation of application No. PCT/EP2019/080738, filed on Nov. 8, 2019.

(51) Int. Cl.
*H03F 3/04* (2006.01)
*H03F 1/02* (2006.01)
*H03F 3/26* (2006.01)

(52) U.S. Cl.
CPC ............ *H03F 1/0222* (2013.01); *H03F 3/26* (2013.01); *H03F 1/0244* (2013.01); *H03F 2200/78* (2013.01)

(58) Field of Classification Search
CPC ...... H03F 1/0222; H03F 3/26; H03F 2200/78; H03F 3/30; H03F 2200/03; H03F 1/0205;
(Continued)

(56) References Cited

U.S. PATENT DOCUMENTS 4,359,650 A      11/1982   Newcomb
6,300,826 B1 *  10/2001   Mathe ................... H03F 3/2171
                                                                      330/10
(Continued)

FOREIGN PATENT DOCUMENTS

CN       202334446 U     7/2012
CN       107548202 A     1/2018
(Continued)

OTHER PUBLICATIONS

Angelfire, "Lab #5—Class AB Power Amplifier Stage", http://www.angelfire.com/yt2/madras/eel/lab5.html—Power Amps (printout), Jun. 22, 2022, 2 pp.

(Continued)

*Primary Examiner* — Khanh V Nguyen
(74) *Attorney, Agent, or Firm* — Perkins Coie LLP; Michael A. Glenn

(57) ABSTRACT

The invention relates to a method for controlling a driver circuit. The method comprises operating an amplifier for providing an output signal, for example an electronic signal for driving or controlling a load, for example a voltage or a current, based on a control signal. The method further comprises operating a comparator for providing the control signal by comparing an input signal, for example an electronic signal with a lower level or a lower amplitude than the output signal, to a feedback signal, wherein the feedback signal is based on the output signal. The method further comprises providing a first supply voltage to the comparator, and providing a second supply voltage to the amplifier, wherein the second supply voltage is higher than the first supply voltage.

11 Claims, 7 Drawing Sheets

(58) Field of Classification Search
CPC ...... H03F 1/0227; H03F 1/0233; H03F 1/025; H03F 1/0255; H03F 3/187; H03F 3/45071; H03F 1/34; H03F 3/45183; H03F 3/3066; H03F 1/307; H03F 3/217; H03F 3/2173; H03F 2200/351; H03F 3/2171

See application file for complete search history.

(56) References Cited

U.S. PATENT DOCUMENTS

| | | | |
|---|---|---|---|
| 7,733,178 B1 * | 6/2010 | Delano | H03F 3/3022 |
| | | | 330/251 |
| 7,777,466 B2 * | 8/2010 | Crippa | G11C 16/30 |
| | | | 323/282 |
| 9,379,679 B2 * | 6/2016 | Noro | H03L 7/0812 |
| 10,063,232 B1 | 8/2018 | Tan et al. | |
| 2003/0146792 A1 | 8/2003 | Ausserlechner | |
| 2005/0242875 A1 | 11/2005 | Gurvich et al. | |
| 2008/0116979 A1 | 5/2008 | Lesso et al. | |
| 2011/0123048 A1 | 5/2011 | Wang et al. | |
| 2012/0049811 A1 | 3/2012 | Wakii et al. | |
| 2014/0240040 A1 | 8/2014 | Langer | |
| 2015/0071464 A1 | 3/2015 | Du et al. | |
| 2016/0149544 A1 * | 5/2016 | Mohan | H03F 1/0205 |
| | | | 330/260 |
| 2017/0371363 A1 | 12/2017 | Habu et al. | |

FOREIGN PATENT DOCUMENTS

| | | |
|---|---|---|
| EP | 2775611 A1 | 9/2014 |
| JP | 2006109133 A | 4/2006 |
| JP | 2009005301 A | 1/2009 |
| JP | 2012054626 A | 3/2012 |
| JP | 2013009177 A | 1/2013 |
| JP | 2013118628 A | 6/2013 |
| WO | 2016176412 A1 | 11/2016 |

OTHER PUBLICATIONS

St Life.Augmented, "TDA7296—Datasheet—70 V-60 W DMOS audio amplifier with mute/ST-BY", https://www.st.com/resource/en/datasheet/tda7296.pdf (printout), 2018, 23 pp.

* cited by examiner

6000

```
┌─────────────────────────────────────────┐
│ Arranging an amplifier 180 so that the  │
│ amplifier 180 is configured to provide  │──6800
│ an output signal 182 based on a         │
│ control signal 122                      │
└─────────────────────────────────────────┘
                    │
                    ▼
┌─────────────────────────────────────────┐
│ Arranging a comparator 120 so that the  │
│ comparator 120 is configured to provide │
│ the control signal 120 by comparing an  │──6200
│ input signal 110 to a feedback signal   │
│ 162, wherein the feedback signal 162 is │
│ based on the output signal 182 of the   │
│ amplifier 180                           │
└─────────────────────────────────────────┘
                    │
                    ▼
┌─────────────────────────────────────────┐
│ Arranging a first voltage supply stage  │
│ 140 and a second voltage supply stage   │
│ 150,                                    │
│                                         │
│ so that the first voltage supply stage  │
│ 140 is configured for providing a first │
│ supply voltage 142 to the comparator    │
│ 120, and                                │──6450
│                                         │
│ so that the second voltage supply stage │
│ 150 is configured for providing a       │
│ second supply voltage 152 to the        │
│ amplifier 180;                          │
│                                         │
│ so that the second supply voltage 152   │
│ is higher than the first supply voltage │
│ 142                                     │
└─────────────────────────────────────────┘
```

Fig. 6

METHOD FOR CONTROLLING A DRIVER CIRCUIT, DRIVER CIRCUIT, SYSTEM COMPRISING A DRIVER CIRCUIT AND METHOD FOR MANUFACTURING AN INTEGRATED CIRCUIT

CROSS-REFERENCE TO RELATED APPLICATION

This application is a continuation of copending International Application No. PCT/EP2019/080738, filed Nov. 8, 2019, which is incorporated herein by reference in its entirety.

Embodiments of the present disclosure relate to the field of amplifying an electronic signal for driving a capacitive load, in particular, for driving a load by a high voltage. More specifically, embodiments relate to a method for controlling a driver circuit. Further embodiments relate to a driver circuit. Further embodiments relate to a system comprising a driver circuit. Further embodiments relate to a method for manufacturing an integrated circuit comprising a driver circuit. Further embodiments relate to an energy efficient high voltage driver circuit for capacitive loads. Further embodiments relate to an electronic circuit for a time-continuous or a time-discrete, high-voltage control of capacitive components, the electronic circuit comprising an integrated voltage processing.

BACKGROUND OF THE INVENTION

Driving a capacitive load, for example an actuator such as a piezoelectric actuator, a thermomechanic actuator, an electrostatically activated actuator or an actuator based on a microelectromechanical system, or an energy storing device, may require high voltages. These high voltages are usually provided and controlled by a driver circuit, for example an amplifier circuit.

Additionally, so-called power amplifiers exist for HiFi applications requiring high output currents. These audio amplifiers may provide output powers in the regime of tens of watts and may therefore supply a loudspeaker which is characterized by its very small resistance (inductance).

Some electronic circuits for driving capacitive components, for example, for driving capacitive components time-continuously, are usually based on the principle of audio amplifiers. In particular, amplifier circuits of the classes AB, D, and H are widely used.

Generally, AB amplifiers consist of a push-pull stage of an operation amplifier, which is controlled continuously. The overall circuit is usually built as a non-inverting amplifier with a resistance divider in the feedback loop. As the time-continuous input signal is provided at the output with the respective amplifying factor, no additional filter stages are required. However, as the output stage of the operation amplifier is permanently conducting a current which is not related to the modulated signal, the power consumption of this amplifier class is problematic, in particular, for high output voltages.

The class H amplifier is an approach trying to minimize the high power loss of the class AB amplifier by adapting the supply voltage of the output stage variably, usually by using an external supply with an up and down converter which requires an appropriate coil which may not be integrated into the circuit due to its size. Beside the required space for external elements, also the high complexity of this setup is disadvantageous.

The output stage of an amplifier of the class D is usually controlled by a pulse width modulation (PWM). Therefore, the power loss of a class D amplifier is reduced to the currents in the moment of switching. For generating the PWM-signal the input signal to be amplified is sampled by a sawtooth voltage in a comparator. Therefore, an energy consuming low pass filter with a sufficiently high cut-off frequency is required after the output stage for filtering the fundamental oscillation of the input stage from the high frequency digital signal. Such a filter after the output stage filters significant parts of the spectrum of the output signal, which have been amplified before, thus reducing the efficiency of the generation of the desired output signal. Alternatively, an amplifier providing a low total harmonic distortion may be used.

It is an object of the present invention to provide a concept for a driver circuit that accomplishes an improved compromise between a low power loss, a small consumption of space, a high voltage output signal, and a low complexity of the circuit.

SUMMARY

An embodiment may have a method for controlling a driver circuit, comprising: operating an amplifier for providing an output signal based on a control signal; operating a comparator for providing the control signal by comparing an input signal to a feedback signal, wherein the feedback signal is based on the output signal; providing a first supply voltage to the comparator; providing a second supply voltage to the amplifier; wherein the second supply voltage is higher than the first supply voltage.

Another embodiment may have a driver circuit, comprising: an amplifier configured to provide an output signal based on a control signal; a comparator configured to provide the control signal by comparing an input signal to a feedback signal, wherein the feedback signal is based on the output signal of the amplifier; wherein the comparator is connected to a first voltage supply stage configured for providing a first supply voltage to the comparator; wherein the amplifier is connected to a second voltage supply stage configured for providing a second supply voltage to the amplifier; and wherein the second supply voltage is higher than the first supply voltage.

Another embodiment may have a system, comprising: a load; a driver circuit according to the invention; wherein the system is configured to control the load based on the output signal of the driver circuit.

Another embodiment may have a method for manufacturing an integrated circuit, the method comprising: arranging an amplifier so that the amplifier is configured to provide an output signal based on a control signal; arranging a comparator so that the comparator is configured to provide the control signal by comparing an input signal to a feedback signal, wherein the feedback signal is based on the output signal of the amplifier; arranging a first voltage supply stage and a second voltage supply stage, so that the first voltage supply stage is configured for providing a first supply voltage to the comparator, and so that the second voltage supply stage is configured for providing a second supply voltage to the amplifier; so that the second supply voltage is higher than the first supply voltage.

Another embodiment may have a non-transitory digital storage medium having a computer program stored thereon to perform the method for controlling a driver circuit, comprising: operating an amplifier for providing an output signal based on a control signal; operating a comparator for providing the control signal by comparing an input signal to a feedback signal, wherein the feedback signal is based on the output signal; providing a first supply voltage to the comparator; providing a second supply voltage to the amplifier; wherein the second supply voltage is higher than the first supply voltage, when said computer program is run by a computer According to the invention, this problem is solved by providing a first supply voltage to a part of a driver circuit configured to provide a control signal for an amplifier of the driver circuit, and by providing a second supply voltage to the amplifier, wherein the second supply voltage is higher than the first supply voltage. Having a first supply voltage and a second supply voltage allows for providing different supply voltages to different parts of the driver circuit. In particular, operating the part of the driver circuit configured to provide the control signal with a supply voltage lower than the supply voltage provided to the amplifier stage, allows for achieving a low power consumption, a high output voltage and a minimal total harmonic distortion of the output signal at the same time. Due to the low power consumption, space-saving components may be chosen for the setup of the driver circuit.

Embodiments according to the invention provide a method for controlling a driver circuit. The method comprises operating an amplifier for providing an output signal, for example an electronic signal for driving or controlling a load, for example a voltage or a current, based on a control signal. The method further comprises operating a comparator for providing the control signal by comparing an input signal, for example an electronic signal with a lower level or a lower amplitude than the output signal, to a feedback signal, wherein the feedback signal is based on the output signal. The method further comprises providing a first supply voltage to the comparator, and providing a second supply voltage to the amplifier, wherein the second supply voltage is higher than the first supply voltage.

The invention is based on the principle to drive different components of the driver circuit with different voltage levels so as to allow for low signal levels and low power consumption in logic components or components configured to provide a control signal or an internal signal of the driver circuit, whilst allowing for a high voltage output signal by providing a high supply voltage to the output stage of the driver circuit, i.e. the amplifier. For example, the control signal may be small compared to the output signal, so that supplying the comparator with a low supply voltage is sufficient. Operating the comparator with a low supply voltage (lower than the second supply voltage) reduces the power consumption of the comparator, for example, by reducing switching currents. As a switching of the comparator may occur at very high frequency, for example at a frequency higher than a frequency of the input signal or the output signal, for example at a frequency that is higher than a frequency of the input signal by a factor of at least 100, reducing a switching current in the comparator is a very efficient way to reduce a power consumption of the driver circuit.

Providing a first supply voltage to the comparator and a second voltage to the amplifier allows for having a high voltage in an output stage of the driver circuit, i.e. in the amplifier, so as to provide a high voltage output signal, and, at the same time, having a low voltage level in a control stage of the driver circuit, i.e. the comparator, so as to reduce the power consumption of the driver circuit.

Minimizing the power consumption of the driver circuit reduces a heat dissipation of the driver circuit, so that the driver circuit may be integrated into smaller geometries. The possibility of integrating the driver circuit into smaller geometries and the reduced energy consumption of the driver circuit are beneficial for an application of the driver circuit in mobile and/or battery driven applications. For example, the driver circuit may be applied for controlling capacitive components, for example for loudspeaker or ultra sonic applications.

According to embodiments, providing the first supply voltage is executed by a first voltage source and providing the second supply voltage is executed by a second voltage source. Therefore, the first supply voltage and the second supply voltage may be chosen independently from each other. Providing the first supply voltage and the second supply voltage by two different voltage sources enhances the flexibility in the design of the driver circuit and opens the possibility to choose two different types of voltage sources.

According to embodiments, providing the first supply voltage is executed by a first charge pump stage and/or providing the second supply voltage is executed by a second charge pump stage. A charge pump is a space-saving component, so that using charge pump stages for providing the first supply voltage and the second supply voltage facilitates an integrated design of the driver circuit, for example, without a coil or another inductive element for providing the first supply voltage and/or the second supply voltage. For example, a charge pump may provide a high second supply voltage, so that providing a high output voltage may be accomplished without having external components for voltage processing. Using a charge pump for providing the first supply voltage and/or the second supply voltage is therefore a space-saving and power-saving way to provide a supply voltage to the comparator and/or the amplifier respectively. Further, using a charge pump facilitates a fully integrated design of the driver circuit.

According to embodiments, an amplitude of the control signal is lower than an amplitude of the output signal. A low amplitude of the control signal may allow for a high electromagnetic compatibility (EMC) of the driver circuit, even if the control signal is a high frequency signal.

As the output signal may typically have a lower frequency and/or may be continuous, a high voltage of the output signal may still comply with a high EMC.

According to embodiments, the comparator is operated so as to provide a continuous-time signal. By operating the comparator so as to provide a continuous-time signal, the comparator may react particularly fast on a change of the input signal, so that the control signal may be very accurate and may follow the input signal very fast. Thus, providing a continuous-time control signal may allow for a fast control of a load by the output signal. Providing a continuous-time signal to the amplifier may allow for providing a high quality output signal without having additional external filter elements or components. A continuous-time operation may provide for a low harmonic distortion of the output signal, that is, for example, the output signal directly follows the input signal.

According to embodiments, the comparator is operated so as to provide a discrete-time signal. Operating the comparator so as to provide a discrete-time signal may imply a low power consumption of the comparator and a high accuracy of the control signal. By adjusting a frequency of the control signal, a discrete-time operation may provide for a low total harmonic distortion of the output signal, wherein adjusting the frequency of the control signal may be singular or adaptive.

According to embodiments, the comparator comprises a self-clocking of the comparator. A self-clocking of the comparator avoids the need for a separate clock for the control signal. Additionally, a self-clocking of the comparator may provide for a low total harmonic distortion of the output signal by optimizing circuit, for example by adjusting a frequency of the control signal.

According to embodiments, the input signal and/or the output signal are continuous in time. Thus, the method may be applied for controlling a load based on a continuous-time signal and for controlling a load with a continuous-time signal.

According to embodiments, the input signal and/or the output signal are discrete in time. Thus, the method may be applied for controlling a load based on a discrete-time signal and for controlling a load with a discrete-time signal.

According to embodiments, operating the amplifier comprises operating a push-pull stage, for example, similar to a class AB amplifier stage. A push-pull stage avoids a high standby current of the amplifier, so that the efficiency, or the power efficiency, of the amplifier may be enhanced by using a push-pull stage.

According to embodiments, operating the amplifier comprises controlling at least one transistor of the first type and at least one transistor of a second type, wherein the first type of transistor and the second type of transistor are complimentary types of transistors, and wherein the first type of transistor and the second type of transistor are one of a FET, a power FET, and a bipolar junction transistor. For example, complimentary types of transistors may be a p-type and an n-type FET or a p-type FET and a PNP bipolar junction transistor or a n-type FET and a NPN bipolar junction transistor. For example, complimentary types of transistors may be transistors with complimentary types of majority charge carriers. Controlling at least one transistor of a first type and at least one transistor of a second type complimentary to the first type is particularly beneficial for operating a push-pull stage. Such an operation of the amplifier may reduce or eliminate a standby current of the amplifier so that a power consumption of the amplifier may be particularly small. At the same time, such an operation of the amplifier may allow for a high range of the output signal, e.g. a high voltage range. Operating a FET as the first type of transistor and/or the second type of transistor may be beneficial in case the output signal of the driver circuit comprises a low current or a low power. Controlling at least one FET may imply providing the control signal as a voltage, so that a power consumption for providing the control signal may be particularly small. Operating a bipolar junction transistor as the first type of transistor and/or the second type of transistor may be beneficial if the output signal comprises a high power or a high current.

According to embodiments, operating the amplifier comprises, during each time instance of a first operating condition, controlling the at least one transistor of the first type either into a conductive state or a cutoff state and the at least one transistor of the second type into the other state, for example, based on the control signal, e.g. a voltage or a current of the control signal. Controlling the at least one transistor of the first type and the at least one transistor of the second type into complimentary states may imply a low power consumption of the amplifier.

According to embodiments, the method further comprises obtaining the feedback signal from the output signal so that a ratio of an amplitude of the feedback signal and an amplitude of the output signal corresponds to an amplification factor of the driver circuit. For example, obtaining the feedback signal from the output signal may comprise dividing a voltage of the output signal by the amplification factor. Therefore, the amplification factor between the input signal and the output signal may be chosen by obtaining the feedback signal from the output signal, for example by dividing the output signal, accordingly. That is, controlling the driver circuit may comprise adjusting the amplification factor of the driver circuit, providing a high flexibility in controlling the driver circuit. Alternatively, the amplification factor of the driver circuit may be fixed for reducing a complexity of the driver circuit.

According to embodiments, the first supply voltage is smaller than the second supply voltage by a factor of at least 2, preferably by a factor of at least 5, more preferably by a factor at least 10. For example, a level of the second supply voltage may set an upper limit for a level of the output voltage. That is, the second supply voltage may be set according to requirements of the application of the driver circuit. A high ratio of the second supply voltage to the first supply voltage facilitates an operation of the comparator at a low supply voltage although the second supply voltage fulfils the requirements of the application. Therefore, a high ratio of the second supply voltage to the first supply voltage may imply a particularly low power consumption of the comparator, so that controlling the driver circuit may combine a high power efficiency and a high output voltage.

According to embodiments, the first supply voltage and/or the second supply voltage are constant. In case the first supply voltage and/or the second supply voltage are constant, providing the first supply voltage and/or the second supply voltage, respectively, by a charge pump may be particularly efficient.

According to embodiments, providing the first supply voltage comprises modulating the first supply voltage and/or providing the second supply voltage comprises modulating the second supply voltage. By modulating the first supply voltage and/or the second supply voltage the modulated supply voltage may be adapted to an operating condition of each time instance of modulation, for example a power provided by the output signal. By modulating the first supply voltage and/or the second supply voltage, a power consumption of the driver circuit may be particularly low. Modulating the second supply voltage may provide for a high efficiency of the push-pull stage. By non-limiting example, the modulation of the second supply voltage may be realized by suitably controlling two resistors or MOSFETs using either a current or a voltage, wherein the resistors or MOSFETs may be located at a positive and a negative supply rail path, which may connect the second voltage supply stage to the amplifier by non-limiting example. By non-limiting example, the second supply voltage may be controlled according to the control signal for the amplifier, e.g. for the push-pull stage.

According to embodiments, operating the amplifier comprises a self-adjusting of a maximum current conducted through or passed through a push-pull stage, wherein the self-adjusting of the maximum current is based on a load. By non-limiting example, self-adjusting of the maximum possible (drive) current through the amplifier, for example through a push-pull stage, may comprise self-adjusting the maximum current in dependence on the load at each time instance of modulation. For example, the self-adjusting of the maximum current may be based on the control signal. As the control signal is based on the feedback signal which is based on the output signal, the maximum current may be adjusted based on a power required by the output signal. That is, the maximum current may be self-adjusted during operation of the driver circuit. Thus, the driver circuit may provide for a high power efficiency and a low or an optimal THD at the same time and independent of a size of a load. For example, in the case of a small load, operating the driver circuit comprises conducting a low maximum current through the amplifier, enabling a low power consumption, while in the case of a big load, operating the driver circuit comprises conducting a high maximum current through the amplifier, thus providing for a low THD. By non-limiting example, self-adjusting the maximum current may be realized by controlling a plurality of resistors or a plurality of MOSFETs using either a current or a voltage. By non-limiting example, self-adjusting the maximum current may be based on the control signal.

A further embodiment according to the invention provides a driver circuit, for example a driver circuit for driving or controlling a load. The driver circuit comprises an amplifier configured to provide an output signal, for example an electronic output signal such as a voltage, based on a control signal, for example a control voltage or a control current configured to control the amplifier, for example a magnitude or an amplitude of the output signal. The driver circuit further comprises a comparator configured to provide the control signal by comparing an input signal to a feedback signal, wherein the feedback signal is based on the output signal of the amplifier. For example, the comparator may be part of a feedback loop. The comparator is connected to a first voltage supply stage configured for providing a first supply voltage to the comparator. The amplifier is connected to a second voltage supply stage configured for providing a second supply voltage to the amplifier. The second supply voltage is higher than the first supply voltage.

The driver circuit relies on the same ideas as the method described above, providing equal or equivalent functionalities and advantages. The driver circuit may optionally be combined with or supplemented by any of the features, functionalities and details described herein with respect to the corresponding method for controlling a driver circuit. The driver circuit may optionally be combined with the mentioned features, functionalities and details both individually or in any combination of them.

According to embodiments, the driver circuit forms at least part of an integrated circuit. As the driver circuit is part of an integrated circuit, it may be implemented particularly space-saving.

Implementing the driver circuit in an integrated circuit is particularly beneficial in combination with the feature that the first voltage supply stage comprises a first charge pump stage and the second voltage supply stage comprises a second charge pump stage. A charge pump stage may be integrated to the integrated circuit and may nevertheless provide a high voltage. Thus, if the driver circuit comprises a first charge pump stage configured to provide a first supply voltage to the comparator and further comprises a second charge pump stage configured to provide the second supply voltage to the amplifier, the driver circuit may be implemented in an integrated circuit including the first voltage supply stage and the second voltage supply stage. Such an arrangement avoids the requirement of external, for example discrete, components, such as a conductance or a resistance or a capacitance.

Implementing the driver circuit in an integrated circuit may further be beneficially combined with the feature that the amplifier comprises at least one FET of an n-type and at least one FET of a p-type, for example, at least one n-type MOSFET and at least one p-type MOSFET. Such a structure of the driver circuit enables a manufacturing of the driver circuit by a CMOS process. Further combining these two features with the feature that the first voltage supply stage comprises a first charge pump and the second voltage supply stage comprises a second charge pump enables a manufacturing of the driver circuit including the first voltage supply stage and the second voltage supply stage in a CMOS process. Manufacturing the driver circuit with a CMOS process may be a very cost efficient and flexible way to produce the driver circuit and enables integrating the driver circuit into an integrated circuit comprising further components.

Further embodiments according to the invention provide a system comprising a load and the driver circuit. The system is configured to control the load based on the output signal of the driver circuit. By using the driver circuit for controlling the load, the load may be controlled by an input signal, which may, for example, be smaller than the output signal, so that the load may be controlled by using a small signal. For example, the driver circuit may be adapted to the load, that is, for example, a level of the output signal may be adapted to the load and/or a power provided by the driver circuit may be adapted to the requirements of the load.

According to embodiments, the system comprises an integrated circuit and the integrated circuit comprises the driver circuit. As the integrated circuit comprises the driver circuit, the system may be particularly space-saving and/or energy efficient and may be manufactured very cost efficiently by using a manufacturing process for an integrated circuit.

According to embodiments, the load comprises a capacity and/or an inductance, and a resistance of the load is higher than 10 k$\Omega$ or 100 k$\Omega$ or 1 M$\Omega$. As the resistance of the load is that high, a current that is required to be provided by the driver circuit to drive the load may be low, even in case a voltage of the output signal of the driver circuit used for driving the load may be high. Thus, by adapting the design of the driver circuit to the power consumption of the load, the driver circuit may consume little power for driving the load. As the driver circuit comprises the first and the second voltage supply stage, it may be adapted to the load very efficiently by adapting the voltage supply stages individually.

For example, a maximum output power of the driver circuit, for example an output power of the driver circuit provided by the output signal, may be designed to be low, e.g. in the mW regime. Therefore, the second voltage supply stage may comprise a charge pump stage for providing the second supply voltage, and may nevertheless be able to provide a sufficiently high power to the amplifier. As a further adaption of the driver circuit to the low output power, the output signal may be configured to have a low level or a low amplitude. Due to the low level of the control signal, a power consumption of the comparator may be low, so that the comparator may be sufficiently supplied by a charge pump stage. Therefore, the combination of the driver circuit with a load with a high resistance enables an integrated design of the system, wherein the driver circuit including the first voltage supply stage and the second voltage supply stage may be part of an integrated circuit, for example an integrated circuit manufactured by a CMOS process. Thus, the arrangement of the system may be particularly space-saving and/or the system may be configured to be particularly power efficient.

According to embodiments, the load comprises a MEMS actuator. A MEMS actuator may be integrated into an integrated circuit, so that the system comprising the MEMS actuator and the driver circuit may be integrated into a common integrated circuit. Thus, the system may be particularly space efficient and may be manufactured in a joint manufacturing process for integrated circuits.

According to embodiments, the load comprises a piezoelectric actuator or a thermal mechanic actuator or an energy storage device. These components may comprise a high capacitive load or may comprise a capacity and/or an inductance and/or may comprise a high resistance, so that they may be driven advantageously by the driver circuit, wherein the driver circuit may for example comprise a charge pump stage for providing the second supply voltage of the driver circuit.

According to embodiments, the load comprises at least one of a loudspeaker, a microphone, a pump, a valve, a help assistance system, a positioning system and a mechanical control for moving plates. These components may comprise high capacitive loads, that is they may comprise a high capacity and/or a high resistance, so that they may be driven advantageously by the driver circuit, even if the driver circuit comprises a charge pump stage for providing the second supply voltage.

A further embodiment according to the invention provides a method for manufacturing an integrated circuit, the method comprises arranging an amplifier, so that the amplifier is configured to provide an output signal based on a control signal. The method further comprises arranging a comparator so that the comparator is configured to provide the control signal by comparing an input signal to a feedback signal, wherein the feedback signal is based on the output signal of the amplifier. Additionally, the method comprises arranging a first voltage supply stage and a second voltage supply stage, so that the first voltage supply stage is configured for providing a first supply voltage to the comparator, and so that the second voltage supply stage is configured for providing a second supply voltage to the amplifier and so that the second supply voltage is higher than the first supply voltage.

A further embodiment according to the invention provides a computer program, wherein the computer programs is configured to implement the above-described method for controlling a driver circuit when being executed on a computer or signal processor, so that the above-described method is implemented by one of the computer programs.

BRIEF DESCRIPTION OF THE DRAWINGS

Embodiments of the present invention will be detailed subsequently referring to the appended drawings, in which:

FIG. 6 shows a block diagram of a method for manufacturing an integrated circuit according to an embodiment.

DETAILED DESCRIPTION OF THE INVENTION

Figure 1:
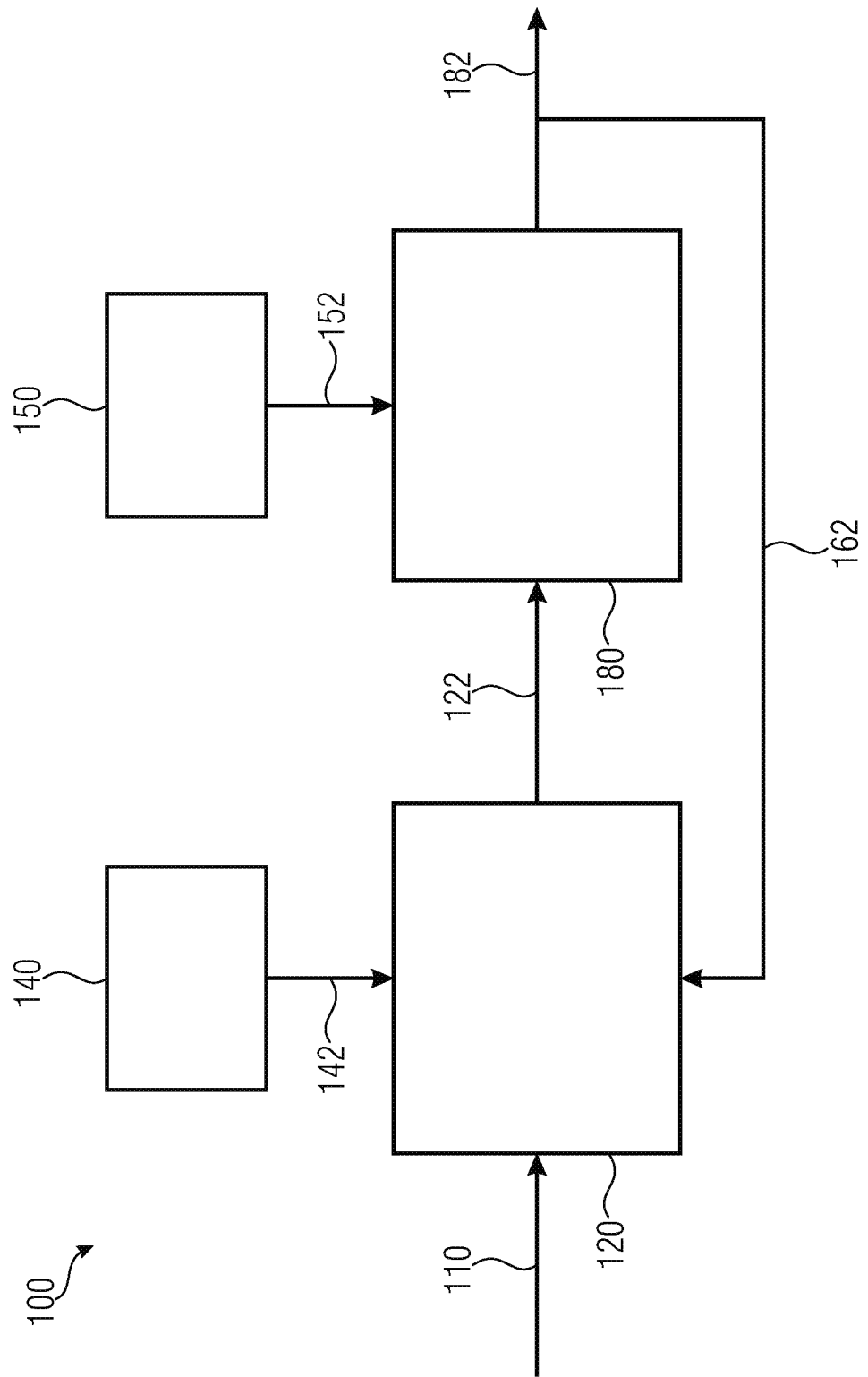
FIG. 1 shows a schematic representation of a driver circuit according to an embodiment.

Equal or equivalent elements or elements with equal or equivalent functionality are denoted in the following description by equal or equivalent reference numerals even if occurring in different figures.

Method steps which are depicted by means of a block diagram and which are described with reference to said block diagram may also be executed in an order different from the depicted and/or described order. Furthermore, method steps concerning a particular feature of a device may be replaceable with said feature of said device, and the other way around.

In the following description, a plurality of details is set forth to provide a more thorough explanation of embodiments of the present invention. However, it will be apparent to those skilled in the art that embodiments of the present invention may be practiced without these specific details. In other instances, well known structures and devices are shown in block diagram form rather than in detail in order to avoid obscuring embodiments of the present invention. In addition, features of the different embodiments described hereinafter may be combined with each other, unless specifically noted otherwise.

Throughout the description, all features, functionalities and details described as examples are to be understood as optional and non-limiting.

FIG. 1 shows a schematic representation of a driver circuit 100 according to an embodiment. The driver circuit 100 comprises an amplifier 180 configured to provide an output signal 182 based on a control signal 122. The driver circuit 100 further comprises a comparator 120 to provide the control signal 122 by comparing an input signal 110 to a feedback signal 162, wherein the feedback signal 162 is based on the output signal 182 of the amplifier 180. The comparator 120 is connected to a first voltage supply stage 140 configured for providing a first supply voltage 142 to the comparator 120. The amplifier 180 is connected to a second voltage supply stage 150 configured for providing a second supply voltage 152 to the amplifier 180, wherein the second supply voltage 152 is higher than the first supply voltage 142.

According to the working principle of the driver circuit 100, by the receiving the feedback signal 162 which is based on the output signal 182, the comparator is capable of providing the control signal 122 to the amplifier 180 so that the amplifier 180 may control the output signal 182 according to the input signal 110.

As a voltage domain of the control signal 122 may be independent from a voltage domain of the output signal 182, the comparator 120 configured for providing the control signal 122 may be provided with the first supply voltage 142 which may be independent from the second supply voltage 152 provided to the amplifier 180 configured to provide the output voltage 182.

The driver circuit 100 according to FIG. 1 may optionally be complimented by all features, functionalities and details that are described herein with respect to the other driver circuits. The respective features, functionalities and details may optionally be added to the driver circuit 100 both individually or in any combination thereof.

Figure 2:
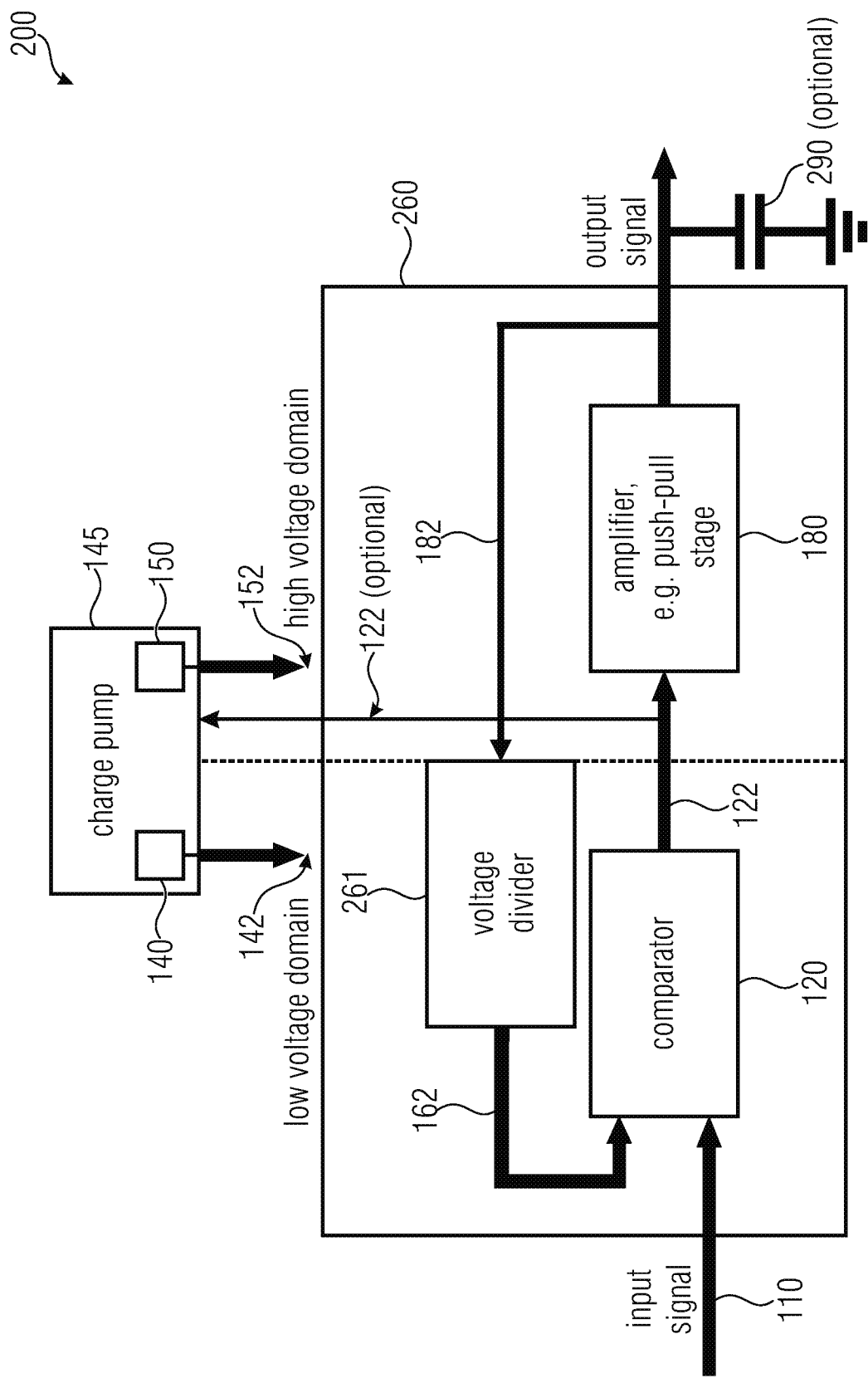
FIG. 2 shows a schematic representation of a driver circuit according to a further embodiment.

FIG. 2 shows a schematic representation of a driver circuit 200 according to an embodiment. The driver circuit 200 may, for example, be based on to the driver circuit 100.

The driver circuit 200 is configured to provide the output signal 182 based on the input signal 110. For example, the driver circuit 200 may be configured to control an optional load 290 based on the input signal 110 by driving the load 290 with the output signal 182. For example, the driver circuit 200 is configured to provide the output signal 182 to the load 290, wherein an amplitude of the output signal 182 is adapted to drive the load 290.

For example, the output signal 182 may be represented by a variable voltage. The voltage of the output signal 182 may give rise to a current, wherein the current may be based on the load 290, for example an electrical resistance or an impedance of the load 290. In other words, the driver circuit may be configured to provide an electric power to the load 290 by providing the output signal 182 to the load.

For example, the voltage of the output signal may be in a range of ±24 V. Alternatively, the voltage of the output signal 182 may be smaller or larger than ±24 V, for example the driver circuit may provide for output voltage in the range of ±400 V. The power provided by the output signal 182 may be, for example, in the regime of mW. Alternatively, the power provided by the output signal 182 may be smaller or may be larger than a power in the regime of mW.

The driver circuit 200 is configured to receive the input signal 110. For example, the input signal 110 may be represented by a variable voltage and a current related to the voltage.

For example, the voltage of the input signal 110 may be in a range of a low voltage signal or a low level signal, e.g. in a range of ±1 V. Alternatively, the voltage of the input signal 110 may be smaller or larger than ±1 V.

For example, the amplitude of the output signal 182 may be equal or larger than the amplitude of the input signal 110. In other words, the driver circuit may be configured to amplify the input signal 110 for providing the output signal 182, wherein an amplification factor of the driver circuit 200 corresponds to a ratio of the amplitude of the output voltage 182 and the amplitude of the input voltage 110.

For example, the input signal 110 and/or the output signal 182 are continuous in time. For example, the input signal 110 and the output signal 182 may be an analog signal. Alternatively, the input signal 110 and/or the output signal 182 are discrete in time.

For amplifying the input signal 110 to provide the output signal 182, the driver circuit 200 comprises a feedback loop 260 comprising the comparator 120, the amplifier 180 and a voltage divider 261, wherein the comparator 120 is configured to control the amplifier 180 based on the feedback signal 162 which is provided by the voltage divider 261 based on the output signal 182 provided by the amplifier.

The voltage divider 261 is configured to provide the feedback signal 162 based on the output signal 182, so that a ratio between the output signal 182 and the feedback signal 162 corresponds to the amplification factor of the driver circuit 200 within an error range which may arise from a limited accuracy and a limited speed of components of the driver circuit. For example, the ratio between the output signal 182 and the feedback signal 162 may be within a range of ±1%, or ±0.1%, or ±0.01% of the amplification factor.

For example, the voltage divider 261 may comprise one or more resistors, one or more transistors and/or one or more capacitors. The voltage divider 261 may be configured to divide the output signal 182 by the amplification factor for obtaining the feedback signal 162. The amplification factor of the driver circuit may be fixed. Alternatively, the voltage divider 261 may be tunable, for example by tuning bits, so that the factor between the output signal 182 and the feedback signal 162 may be adjusted, for example according to the application of the driver circuit 200, for example according to the load 290 and/or according to the amplitude of the input signal 110.

That is, the driver circuit 200 comprises a feedback loop 260 configured to obtain the feedback signal 162 from the output signal 182, wherein a ratio of an amplitude of the feedback signal 162 and an amplitude of the output signal 182 corresponds to an amplification factor of the driver circuit 200.

The comparator 120 is configured to compare the input signal 110 to the feedback signal 162 to obtain the control signal 122. For example, the comparator 120 may provide the control signal 122 as a digital signal comprising a high level and a low level, wherein the comparator is configured to provide the control signal 122 in either the high level or the low level in a time instance of the feedback signal 162 being larger than the input signal 110, and in the other level in a time instance of the feedback signal 162 being smaller than the input signal 110.

For example, the comparator is a continuous-time comparator. For example, the comparator 120 may be configured to provide the control signal 122 as a continuous-time signal.

Alternatively, the comparator is a discrete-time comparator. For example, the comparator may be configured to provide the control signal 122 as a discrete-time signal.

For example, the comparator is a discrete-time comparator and the comparator is self-clocked. For example, the comparator 120 may be configured to provide the control signal 122 as a discrete-time signal, wherein the control signal 122 comprises a synchronization information about a clock of the control signal 122.

The amplifier 180 is configured to receive the control signal 122 and to control the output signal 182 based on the control signal 122. The amplifier 180 may comprise a push-pull stage. The push-pull stage may comprise at least two complimentary stages.

A stage of the at least two complementary stages may comprise a transistor, for example a field effect transistor (FET), such as a MOSFET or a power FET, or a bipolar junction transistor. The at least two complementary stages of the push-pull stage may comprise a first type of transistor and a second type of transistor complementary to the first type of transistor. For example, complementary types of transistors may comprise opposite types of majority charge carriers. For example, complementary types of transistors may be represented by a p-type FET and a n-type FET, or a npn bipolar junction transistor and a pnp bipolar junction transistor, or a p-type FET and a pnp bipolar junction transistor, or a n-type FET and a npn bipolar junction transistor.

That is, the amplifier 182 comprises at least one transistor of a first type and at least one transistor of a second type, wherein the first type of transistor and the second type of transistor are complimentary types of transistors, and wherein the first type of transistor and the second type of transistor are one of a FET, a power FET, or a bipolar junction transistor.

A stage of the at least two complimentary stages may be configured to provide a contribution to the output signal 182 in dependence of a conductance of the stage. For example, a stage of the at least two complimentary stages may be in a conductive state or in a cut-off state, that is a state with a low or vanishing conductance compared to the conductance of the conductive state. The amplifier 180 may be configured to provide a signal based on the control signal 122 to the at least two complementary stages, the signal controlling the conductance of the at least two complementary stages to be either in the conductive state or in the cut-off state. For example, the amplifier 180 may be configured to control a first stage of the at least two complementary stages to be in a conductive state, when the level of the control signal 122 is within in a first range, and to control a second stage of the at least two complementary stages to be in a conductive state, when the level of the control signal 122 is within in a second range. For example, the first range and the second range may be opposite, so that for an instant level of the control signal 122, for example the high-level or the low-level, either the first stage of the second stage may be configured to be in the conductive state, while the other stage may be in the cut-off stage. For example, the first range and the second range may overlap, so that for a value of the control signal 122 that is between the high-level and the low-level at a moment of operation, both stages may be in a conductive state. Such an overlap may avoid be beneficial for avoiding artifacts in the output signal.

For example, the comparator 120 is configured to provide the control signal 122, wherein the control signal 122 comprises a fast slew rate, for example a slew rate higher than 50 MV/s or higher than 100 MV/s or higher than 400 MV/s. Additionally, the overlap of the first range and the second range of the level of the control signal may be small, for example smaller than 10% or smaller than 5% or smaller 1% of the amplitude of the control signal 122. This combination enables a very efficient operation of the amplifier with a particularly low power loss.

That is, the first type of transistor and the second type transistor are configured to be in a conductive state or in a cut-off state or to change between the conductive state and the cut-off state or to change their conductivity based on the control signal 122.

In other words, the driver circuit 200 is configured for, during each time instance of a first operating condition, controlling the at least one transistor of the first type either into a conductive state or a cutoff state and the at least one transistor of the second type into to the other state. The driver circuit 200 comprises a first voltage supply stage configured to provide a first supply voltage 142 to the comparator 120. A level or an amplitude of the first supply voltage 142 may, for example, correspond to a maximum level or a maximum amplitude of the control signal 122. The first voltage supply stage may comprise a first voltage slew to provide the first supply voltage 142.

That is, an amplitude of the control signal may be lower than an amplitude of the output signal.

For example, the push-pull stage may be realized as an AB amplifier. For example, the push-pull stage may comprise a standard inverter, for example, comprising a p-type FET and a n-type FET. Alternatively, the push-pull stage may comprise a cascaded inverter with a delayed or a non-overlapping control for avoiding short-circuit currents in a moment of switching. A cascaded inverter may, for example, comprise one or more p-type FETs and one or more n-type FETs in series. Alternatively, the push-pull stage may comprise one or more MOSFETs and/or one or more bipolar junction transistors.

According to embodiments, the amplifier 180 is configured for self-adjusting a maximum current conducted through or passed through a push-pull stage, wherein the self-adjusting of the maximum current is based on a load 290.

For example, the maximum current may be a maximum possible current or an upper limit for a current, for example a current used or consumed for providing the output voltage 182. For example, the amplifier 180 may be configured for self-adjusting the maximum current according to the control signal 122, and thus, for example, without external influence. For example, the power that is required to provide the output signal may depend on the load 290, and the amplifier 180 may be configured to obtain an information about a power that is required to provide the output signal 182 by using the control signal 122. Thus, the amplifier 180 may be configured to self-adjust the maximum current according to a power consumption or a power requirement of the load 290.

The driver circuit 200 comprises a charge pump 145. The charge pump 145 comprises the first voltage supply stage 140 and the second voltage supply state 150. According to the embodiment, the first voltage supply stage 140 comprises a first charge pump stage configured to provide the first supply voltage 142 to the comparator 120, and the second voltage supply stage 150 comprises a second charge pump stage configured to provide the second supply voltage 152 to the amplifier 180. For example, the charge pump 145, the first charge pump stage and/or the second charge pump stage may comprise a Dickson charge pump.

That is, the first voltage supply stage 140 comprises a first charge pump stage and/or the second voltage supply stage 150 comprises a second charge pump stage.

According to alternative embodiments, the first charge pump stage may be part of a first charge pump and the second charge pump stage may be part of a second charge pump.

According to further alternative embodiments, the driver circuit 200 does not necessarily comprise the charge pump 145. According to this alternative embodiment, the first voltage supply stage 140 may comprise a first voltage source and/or the second voltage supply stage 150 may comprise a second voltage source. For example, the first voltage source and/or the second voltage source may comprise a boost-converter, a buck-converter, a buck-boost converter, a charge pump, a charge pump stage or a low-dropout regulator (LDO). By non-limiting example, the first voltage supply stage 140 and/or the second voltage supply stage 150 may be realized by a separate source and a subsequent controller.

Thus, the first voltage supply stage 140 may comprise a first voltage source and the second voltage supply stage 150 comprises a second voltage source.

The first supply voltage 142 may be adapted to an amplitude of the control signal 122, which may be adapted to the amplifier 180 and/or adapted to the amplitude of the output signal 182. For example, the first voltage supply stage 140, may be configured to provide the first supply voltage 142 as a constant or fixed voltage. That is, the first supply voltage 142 may be constant.

Alternatively, the first voltage supply stage may be configured to modulate the first supply voltage.

For example, the first supply voltage 142 may be modulated, for example, according to a power consumption of the comparator 120 or a current amplitude of the control signal during each time instance of operation.

The second supply voltage 152 may be adapted to a maximum level or maximum amplitude of the output signal 182. For example, the second supply voltage 152 may be equal to or larger than the amplitude of the output signal 182.

According to embodiments, the second supply voltage 152 may be constant.

For example, the second voltage supply stage 150 may be configured to provide the second supply voltage 152 as a constant or fixed voltage, wherein the second supply voltage 152 may correspond to a maximum required amplitude of the output signal, for example, as required by the load 290.

Alternatively, the second voltage supply stage 150 may be configured to modulate the second supply voltage 152.

For example, the second supply voltage 152 may be modulated, for example, according to a power consumption of the amplifier 180, e.g. a push-pull stage, or according to a current required level of the output signal 182 during each time instance of operation. For example, the second voltage supply stage 150 may comprise a low voltage rail and a high voltage rail, and modulating the second supply voltage 152 may comprise controlling the respective contributions of a voltage of the low voltage rail and a voltage of the high voltage rail based on the control signal 122. As the control signal 122 is based on the feedback signal 162, the control signal may comprise an information about a required power of the amplifier 180 and/or the output signal 182. Thus, using the control signal 122 for modulating the second supply voltage 152 may provide for an adjustment of the second supply voltage 152 according to a power consumption of the push-pull stage 280. That is, the driver circuit 200 may be configured for self-adjusting the second supply voltage 152. By non-limiting example, the controlling the second supply voltage 152 based on the control signal 122 may be realized by two resistors or MOSFETs.

As the second supply voltage 152 may be adapted to the output signal 182 and the first supply voltage 142 may be adapted to the control signal 122. The first supply voltage 142 may be different than the second supply voltage 152. In particular, the first supply voltage 142 may be smaller than the second supply voltage 152.

For example, the first supply voltage 142 is smaller than the second supply voltage 152 by a factor of at least two, preferably by a factor of at least five, more preferably by a factor of at least ten.

For example, the amplitude of the output signal may be dictated by the application of the driver circuit 200, for example, by the load 290. Still, the amplitude of control signal 122 may be smaller than the amplitude of the output signal 182. The smaller the amplitude of the control signal 122, the more power may be saved during operation of the driver circuit 200.

According to embodiments, the driver circuit 200 forms at least a part of an integrated circuit.

For example, the driver circuit 200 may optionally be integrated to an integrated circuit, for example, together with the load 290 and/or together with further components. In particular, the driver circuit 200 may be integrated into an integrated circuit including the first charge pump stage and the second charge pump stage.

In other words, the driver circuit 200 may be configured to receive a continuous-time input signal 110 with variable and small amplitude. The driver circuit may further be configured to amplify the input signal 110 by a factor dependent on an adjustable resistance divider 261 to obtain a continuous-time output signal 182 with variable and equal or higher amplitude compared to the small amplitude of the input signal 110. For example, a typical load of MEMS components forming a principal load 290 of the driver circuit may be represented by a capacitor. The continuous-time output signal 182 may be generated by a push-pull inverter stage, e.g. the amplifier 180, which is connected to a high voltage domain, e.g. the second supply voltage 152. Further, the push-pull inverter stage may be configured to be controlled by the comparator 120 which may be connected to a low voltage domain, e.g. the first supply voltage 142. The low voltage domain and the high voltage domain may be generated by an integrated charge pump 145 and may be fixed at a constant level. An optional, initial voltage source for the charge pump 145 may be of arbitrary type.

For example, the working principle of the driver circuit 200 corresponds to the principle of a feedback loop. The driver circuit 200 may be configured to return the continuous-time output signal 182 via the adjustable voltage divider 261 to an input of the comparator 120. The comparator 120 may be configured to receive the input signal 110 on a second input and is configured to compare the input signal 110 to the returned feedback signal 162. The comparator 120 may be configured to generate a high- or low-level signal in dependence on its input signals, i.e. the input signal 110 and the feedback signal 162, wherein the comparator 120 may be configured to generate the high- or low-level signal according to the low voltage domain. The comparator 120 may be configured to provide the high- or low-level signal at an output of the generator 120 as the control signal 122. The driver circuit 200 may be configured to control the amplifier 180, e.g. a push-pull inverter stage, based on the resulting control signal 122, such completing the feedback loop. Further, the driver circuit 200 may be configured to rely on the capacitance of the MEMS-component, e.g. the load 290, for smoothening or filtering the output signal 182, so that the driver circuit 200 may require less or no additional external components or filter stages.

In contrast to conventional class AB amplifiers, which may be optimized for a resistive load, the driver circuit 200 comprises the second voltage supply stage 150 configured for providing the second supply voltage 152, that is, the voltage domain of the output signal 182, wherein the second voltage supply stage is integrated, that is internal, part of the driver circuit 200. Further conventional solutions rely on a boost converter, external components, an additional pulse generator, an analog-digital converter and further signal processing units for controlling the output stage, while the driver circuit 200 comprises a charge pump 145, a comparator 120, for example an analog or a digital comparator and may be implemented fully integrated. Further conventional solutions require a RC low pass output filter, while the driver circuit 200 may provide the output signal directly to the load 290. Instead of a bipolar high voltage power amplifier, the driver circuit 200 may comprise MOSFETs and may still provide a high output voltage. Further, the driver circuit 200 may be operated with a single stage for voltage and power amplification. The driver circuit 200 comprises two voltage domains, for example, a low voltage domain provided by the first supply voltage 142 and a high voltage domain provided by the second supply voltage 152. Additionally, the driver circuit 200 may be configured to drive a variable load, for example a variable capacitance. Other than conventional amplifiers of the classes A, B, C, D, AB, G or H, the driver circuit 200 may efficiently amplify a low voltage input signal and may efficiently control capacitive loads with high, continuous-time voltages. Other than some conventional solutions, the driver circuit 200 may, for example, be realized without an H-bridge, a digital analog converter, a separate corrector unit and a separate pulse width module.

To summarize, the driver circuit 200 may provide a low complexity circuit design being capable of combining a high output voltage with a low power consumption. Additionally, the driver circuit 200 may optionally be fully integrated to an integrated circuit and may utilize components that may be manufactured using a CMOS process.

Figure 3:
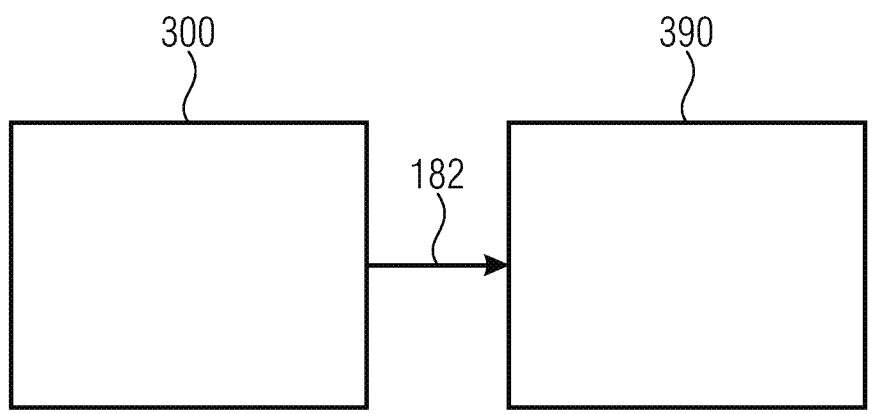
FIG. 3 shows a schematic representation of a system comprising a driver circuit according to an embodiment, FIGS. 4A, B show diagrams of the variation over time of an input signal, an output signal, a feedback signal, and a control signal according to an embodiment.

FIG. 3 shows a schematic representation of a system 301 according to an embodiment. The system 301 comprises a driver circuit 300. The driver circuit 300 may correspond to the driver circuit 100, 200. The system 301 further comprises a load 390 which may correspond to the load 290. The system 301 is configured to control the load 390 based on the output signal 182 of the driver circuit 300.

According to embodiments, the load 390 comprises a capacity and/or an inductance, and a resistance of the load is higher than 10 kOhm or 100 kOhm or 1 MOhm.

The load 390 may, for example, be characterized by a capacitance. For example, the load 390 may be purely or mainly capacitive. Alternatively, the load 390 may be mainly capacitive and may further comprise or be characterized by a resistance and/or an inductance, so that a resulting resistance of the load 390 may be in the regime of MOhm or may be larger than 10 kOhm or 100 kOhm or 1 MOhm. The larger the resistance of the load 390, the lower the power consumption of the amplifier of the driver circuit 300 may be for a given amplitude of the output signal 182, so that the second supply voltage of the driver circuit 300 may be provided by a charge pump.

According to embodiments, the system 301 comprises an integrated circuit, and the integrated circuit comprises the driver circuit 300.

For example, the driver circuit 300 is part of an integrated circuit. For example, the driver circuit 300 and the load may be part of a joint integrated circuit.

According to embodiments, the load 390 comprises a MEMS actuator or a piezoelectric actuator or a thermomechanic actuator.

The load 390 may, for example, comprise a MEMS component and/or a piezoelectric actuator, for example a bending actuator, for example an electrostatic bending actuator (NED-actuator), piezoelectric actuators or thermomechanical actuators.

According to embodiments, the load 390 comprises at least one of a loudspeaker, a microphone, a pump, a valve, a health assistance system, a positioning system and a mechanical control for moving plates.

According to a further embodiment, the load 390 comprises an energy storing device.

The output signal 182 of the driver circuit 300 may be adapted to the characteristics of the load 390. For example, the load 390 may be mainly capacitive, so that the driver circuit 300 may be configured to provide a low power to the load 390 via the output signal 182. Thus, the driver circuit 300 may comprise a second charge pump stage configured for providing the second supply voltage to the amplifier. The amplifier may comprise FETs or MOSFETs of the first type and of the second type, so that the amplifier may be configured to provide the output signal 182 based on a low power control signal, that is, a current and/or a voltage of the control signal may be small. Thus, the driver circuit 300 may comprise a first charge pump stage configured for providing the first supply voltage to the comparator configured to provide the control signal. The first charge pump stage, the second charge pump stage, the comparator and the amplifier may be integrated to an integrated circuit, so that the driver circuit 300 may be fully integrated. Thus, the driver circuit 300 and optionally also the load 390 may be manufactured using a CMOS process.

In contrast, conventional driver circuits, such as a classic class AB amplifier, comprise one supply voltage domain corresponding to the level of the desired output voltage. For example, power amplifiers are the main application of AB amplifiers. The dominating power consumption of a power amplifier arises in the output stage, so that the power supply of a power amplifier is configured for providing large powers. Thus, a power amplifier may rely on external components such as external inductors or capacitors.

Figure 4A:
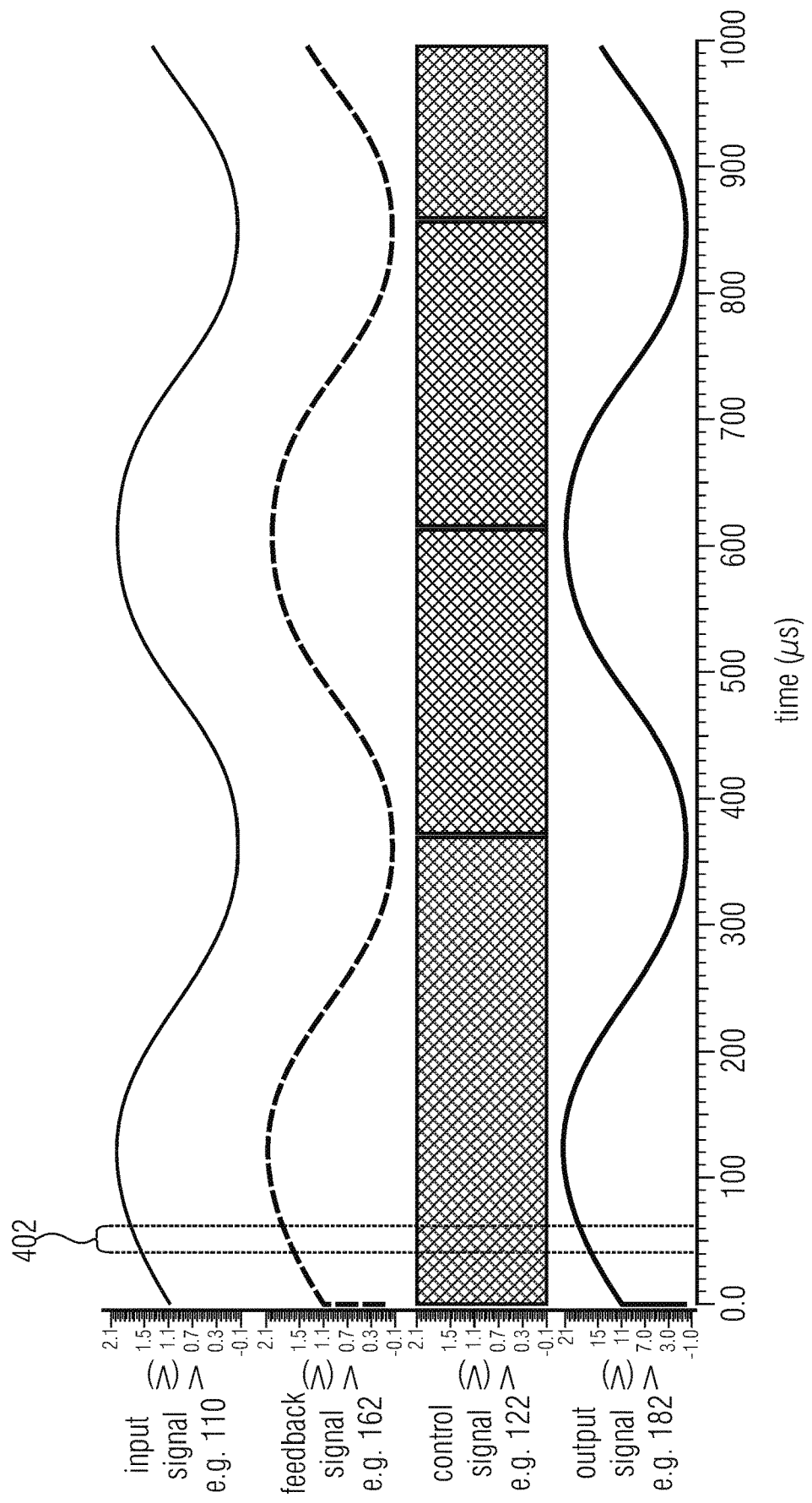

FIG. 4A shows a diagram of the variation over time of the input signal 110, the output signal 182, the feedback signal 162, and the control signal 122 according to an embodiment. The diagram shows an exemplary time span of 100 μs.

Figure 4B:
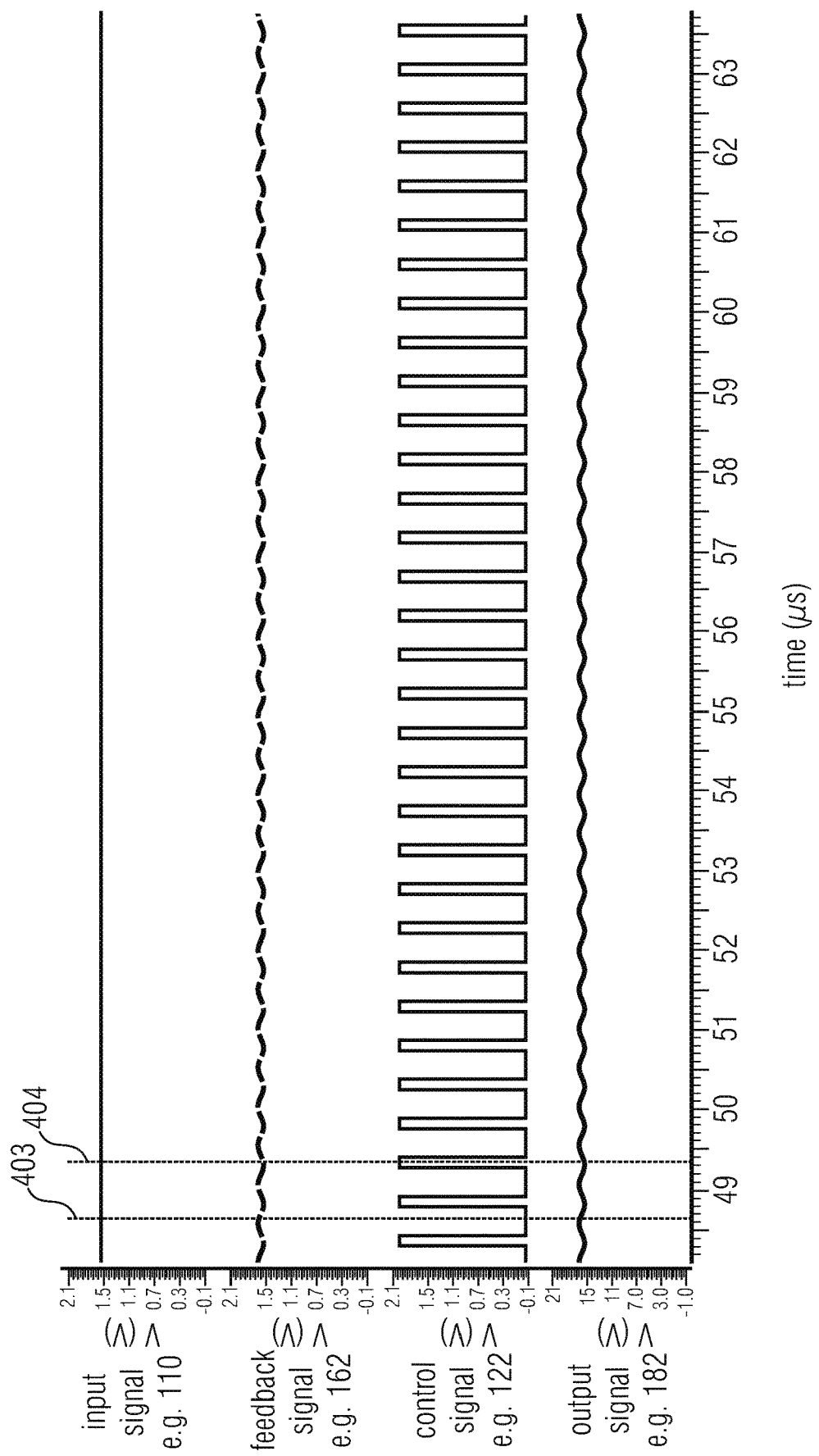

FIG. 4B shows a zoomed-in view of a time span 402 of the diagram shown in FIG. 4A.

According to the embodiment shown in FIGS. 4A and 4B, the feedback signal is derived from the output signal by dividing the output signal by a factor of 10, which may be performed by the voltage divider 261. The control signal is generated by comparing the input signal to the feedback signal, so that the level of the control signal corresponds to a low level at a time when the feedback signal is larger than the input signal (e.g. time 403 in FIG. 4B), and so that the level of the control signal corresponds to a high level at a time when the feedback signal is larger than the input signal (e.g. time 404 in FIG. 4B).

For example, the amplifier 180 may be configured to adapt the output signal based on the control signal, wherein the amplifier 180 increases the output voltage, if the level of the control signal provided to the amplifier corresponds to the high level, and wherein the amplifier 180 deceases the output voltage, if the level of the control signal provided to the amplifier corresponds to the low level. For example, the amplifier may be configured for increasing or decreasing the output signal may be performed by switching between two complementary stages of a push-pull stage of the amplifier or by changing a weight between contributions of two complementary stages of a push-pull stage of the amplifier.

Figure 5:
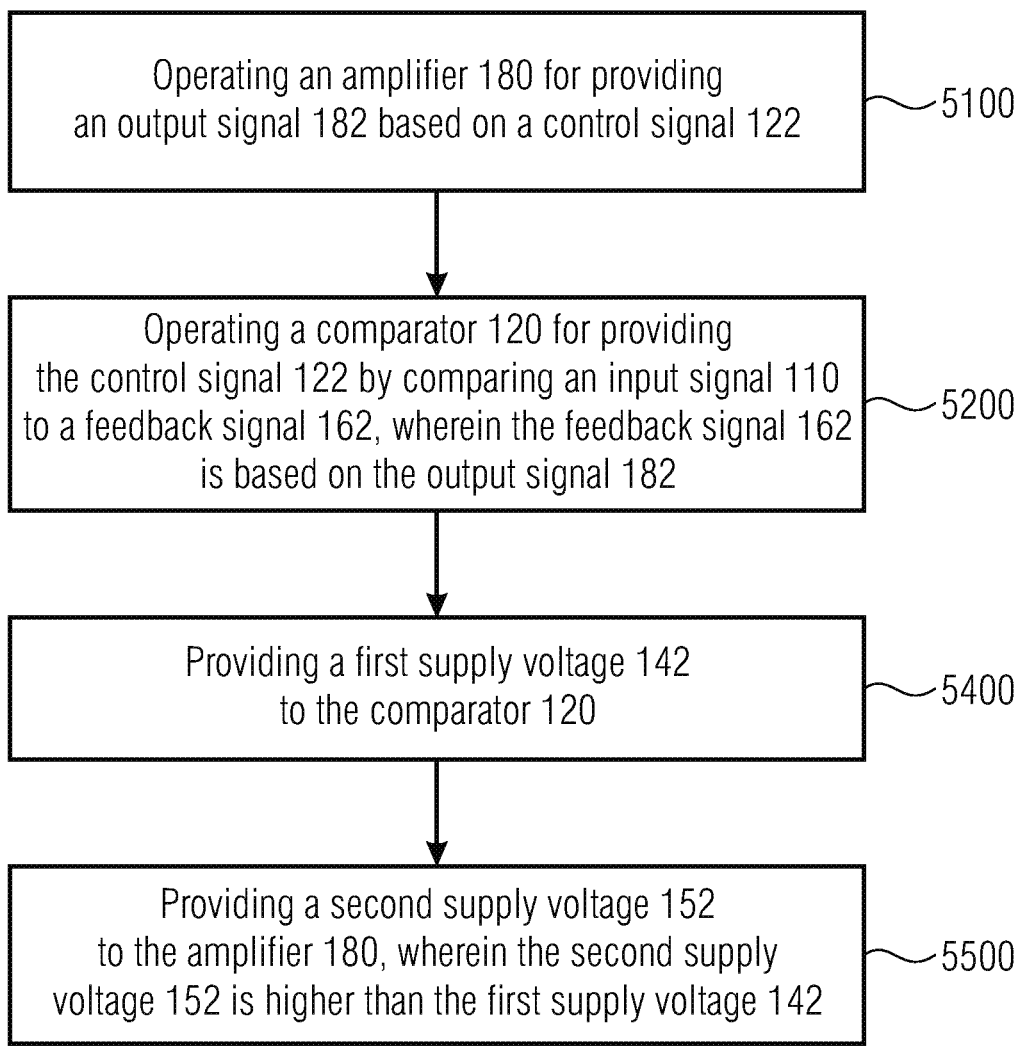
FIG. 5 shows a block diagram of a method for controlling a driver circuit according to an embodiment.

FIG. 5 shows a block diagram of a method 5000 for controlling a driver circuit, for example the driver circuit 100;200;300, according to an embodiment. The method 5000 comprises operating 5100 an amplifier 180 for providing an output signal 182 based on a control signal 122. The method 5000 further comprises operating 5200 a comparator 120 for providing the control signal 122 by comparing an input signal 110 to a feedback signal 162, wherein the feedback signal 162 is based on the output signal 182. Additionally, the method 5000 comprises providing 5400 a first supply voltage 142 to the comparator 120 and providing 5500 a second supply voltage 152 to the amplifier 180, wherein the second supply voltage 152 is higher than the first supply voltage 142.

The order of the steps of the method 5000 as shown in FIG. 5 is chosen exemplarily, that is, the steps may be executed in arbitrary order or in parallel. Controlling the driver circuit may be performed particularly efficiently or fast, if the steps of the method 5000 are executed in parallel.

FIG. 6 shows a block diagram of a method 6000 for manufacturing an integrated circuit according to an embodiment. The method 6000 comprises arranging 6800 an amplifier 180 so that the amplifier 180 is configured to provide an output signal 182 based on a control signal 122. The method 6000 further comprises arranging 6200 a comparator 120 so that the comparator 120 is configured to provide the control signal 120 by comparing an input signal 110 to a feedback signal 162, wherein the feedback signal 162 is based on the output signal 182 of the amplifier 180. Additionally, the method 6000 comprises arranging 6450 a first voltage supply stage 140 and a second voltage supply stage 150, so that the first voltage supply stage 140 is configured for providing a first supply voltage 142 to the comparator 120, and so that the second voltage supply stage 150 is configured for providing a second supply voltage 152 to the amplifier 180 and so that the second supply voltage 152 is higher than the first supply voltage 142.

The order of the steps of the method 6000 as shown in FIG. 6 is chosen exemplarily, that is, the steps may be executed in arbitrary order or in parallel.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Method for controlling a driver circuit, comprising:
   operating an amplifier for providing an output signal based on a control signal;
   operating a comparator for providing the control signal by comparing an input signal to a feedback signal, wherein the feedback signal is based on the output signal;
   providing a first supply voltage to the comparator;
   providing a second supply voltage to the amplifier;
   wherein the second supply voltage is higher than the first supply voltage; and
   wherein the first voltage supply stage is provided by a first charge pump stage and wherein the second voltage supply stage is provided by a second charge pump stage.

2. Driver circuit, comprising:
   an amplifier configured to provide an output signal based on a control signal;
   a comparator configured to provide the control signal by comparing an input signal to a feedback signal, wherein the feedback signal is based on the output signal of the amplifier;
   wherein the comparator is connected to a first voltage supply stage configured for providing a first supply voltage to the comparator;
   wherein the amplifier is connected to a second voltage supply stage configured for providing a second supply voltage to the amplifier;

wherein the second supply voltage is higher than the first supply voltage; and wherein the first voltage supply stage comprises a first charge pump stage and wherein the second voltage supply stage comprises a second charge pump stage.

3. Driver circuit according to claim 2, wherein the first voltage supply stage comprises a first voltage source and the second voltage supply stage comprises a second voltage source.

4. Driver circuit according to claim 2, wherein an amplitude of the control signal is lower than an amplitude of the output signal.

5. Driver circuit according to claim 2, wherein the amplifier comprises a push-pull stage.

6. Driver circuit according to claim 2 further comprising a feedback loop configured to acquire the feedback signal from the output signal 182;

wherein a ratio of an amplitude of the feedback signal and an amplitude of the output signal corresponds to an amplification factor of the driver circuit.

7. Driver circuit according to claim 2, wherein the first supply voltage is smaller than the second supply voltage by a factor of at least 2, preferably by a factor of at least 5, more preferably by a factor of at least 10.

8. Driver circuit according to claim 2, wherein the amplifier is configured for self-adjusting a maximum current conducted through a push-pull stage, wherein the self-adjusting of the maximum current is based on a load.

9. System, comprising:

a load;

a driver circuit according to claim 2;

wherein the system is configured to control the load based on the output signal of the driver circuit.

10. System according to claim 9, wherein the system comprises an integrated circuit, and wherein the integrated circuit comprises the driver circuit.

11. System according to claim 9, wherein the load comprises a capacity and/or an inductance;

and wherein a resistance of the load is higher than 10 kOhm or 100 kOhm or 1 MOhm.

* * * * *